(12) United States Patent
Oladeji et al.

(10) Patent No.: US 8,022,548 B2
(45) Date of Patent: Sep. 20, 2011

(54) METHOD FOR FABRICATING CONDUCTING PLATES FOR A HIGH-Q MIM CAPACITOR

(75) Inventors: Isaiah O. Oladeji, Gotha, FL (US); Alan Cuthbertson, Newcastle upon Tyne (GB)

(73) Assignee: Atmel Corporation, San Jose, CA (US)

( * ) Notice: Subject to any disclaimer, the term of this patent is extended or adjusted under 35 U.S.C. 154(b) by 169 days.

(21) Appl. No.: 12/569,750

(22) Filed: Sep. 29, 2009

(65) Prior Publication Data

US 2010/0019349 A1    Jan. 28, 2010

Related U.S. Application Data

(62) Division of application No. 11/549,052, filed on Oct. 12, 2006, now Pat. No. 7,601,604.

(51) Int. Cl.
*H01L 21/00* (2006.01)

(52) U.S. Cl. ......... 257/758; 257/E21.579; 257/E23.079; 257/E23.144

(58) Field of Classification Search .................. 257/499, 257/758, E32.579, 23.079, 144
See application file for complete search history.

(56) References Cited

U.S. PATENT DOCUMENTS

| | | |
|---|---|---|
| 6,197,181 B1 | 3/2001 | Chen |
| 6,268,289 B1 | 7/2001 | Chowdhury et al. |
| 6,320,244 B1 | 11/2001 | Alers et al. |
| 6,346,454 B1 | 2/2002 | Sung et al. |
| 6,387,775 B1 | 5/2002 | Jang et al. |
| 6,420,262 B1 | 7/2002 | Farrar |
| 6,436,787 B1 | 8/2002 | Shih et al. |
| 6,492,269 B1 | 12/2002 | Liu et al. |
| 6,511,912 B1 | 1/2003 | Chopra et al. |
| 6,599,807 B2 | 7/2003 | Lim et al. |
| 6,723,600 B2 | 4/2004 | Wong et al. |
| 6,744,090 B2 | 6/2004 | Kim |
| 6,753,618 B2 | 6/2004 | Basceri et al. |
| 6,830,971 B2 | 12/2004 | Balakumar et al. |

(Continued)

FOREIGN PATENT DOCUMENTS

WO    WO-2008045672 A2    4/2008

(Continued)

OTHER PUBLICATIONS

"U.S. Appl. No. 11/549,052, Non-Final Office Action mailed Nov. 6, 2008", 12 pgs.

(Continued)

*Primary Examiner* — Michael S Lebentritt
(74) *Attorney, Agent, or Firm* — Fish & Richardson P.C.

(57) ABSTRACT

A method of forming one or more capacitors on or in a substrate and a capacitor structure resulting therefrom is disclosed. The method includes forming a trench in the substrate, lining the trench with a first copper-barrier layer, and substantially filling the trench with a first copper layer. The first copper layer is substantially chemically isolated from the substrate by the first copper-barrier layer. A second copper-barrier layer is formed over the first copper layer and a first dielectric layer is formed over the second copper-barrier layer. The dielectric layer is substantially chemically isolated from the first copper layer by the second copper-barrier layer. A third copper-barrier layer is formed over the dielectric layer and a second copper layer is formed over the third copper-barrier layer. The second copper layer is formed in a non-damascene process.

9 Claims, 9 Drawing Sheets

U.S. PATENT DOCUMENTS

| | | | |
|---|---|---|---|
| 6,919,266 B2 | 7/2005 | Ahn et al. | |
| 6,967,154 B2 | 11/2005 | Meng et al. | |
| 6,972,492 B2 | 12/2005 | Pai | |
| 7,018,868 B1 | 3/2006 | Yang et al. | |
| 7,087,517 B2 | 8/2006 | Andreyushchenko et al. | |
| 7,091,542 B1 | 8/2006 | Yang et al. | |
| 7,220,652 B2 | 5/2007 | Kim et al. | |
| 7,250,334 B2 | 7/2007 | Crenshaw et al. | |
| 7,285,490 B2 * | 10/2007 | Barth et al. | 438/638 |
| 7,332,764 B2 | 2/2008 | Choi et al. | |
| 7,368,343 B2 | 5/2008 | Yang | |
| 7,378,719 B2 | 5/2008 | Yang | |
| 7,755,196 B2 * | 7/2010 | Barth et al. | 257/758 |
| 2002/0155676 A1 | 10/2002 | Stetter et al. | |
| 2003/0162384 A1 | 8/2003 | Smith | |
| 2004/0056324 A1 | 3/2004 | Ning et al. | |
| 2004/0102014 A1 | 5/2004 | Ning et al. | |
| 2004/0217410 A1 | 11/2004 | Meng et al. | |
| 2005/0024979 A1 | 2/2005 | Kim et al. | |
| 2005/0156278 A1 | 7/2005 | Coolbaugh et al. | |
| 2005/0282346 A1 | 12/2005 | Barth et al. | |
| 2006/0170024 A1 | 8/2006 | Yang et al. | |
| 2007/0200162 A1 | 8/2007 | Tu et al. | |
| 2008/0020540 A1 | 1/2008 | Takeda et al. | |
| 2008/0057664 A1 | 3/2008 | Yang | |
| 2008/0089007 A1 | 4/2008 | Oladeji et al. | |
| 2008/0128856 A1 | 6/2008 | Kwak | |

FOREIGN PATENT DOCUMENTS

WO WO-2008045672 A3 4/2008

OTHER PUBLICATIONS

"U.S. Appl. No. 11/549,052, Response filed Feb. 6, 2009 to Non-Final Office Action mailed Nov. 6, 2008", 10 pages.

"U.S. Appl. No. 11/549,052, Notice of Allowance mailed Jun. 2, 2009", 8 pgs.

"International Application No. PCT/US07/79292, International Search Report and Written Opinion mailed Mar. 26, 2008", 8 pgs.

US 6,882,028, 04/2005, Yang (withdrawn)

* cited by examiner

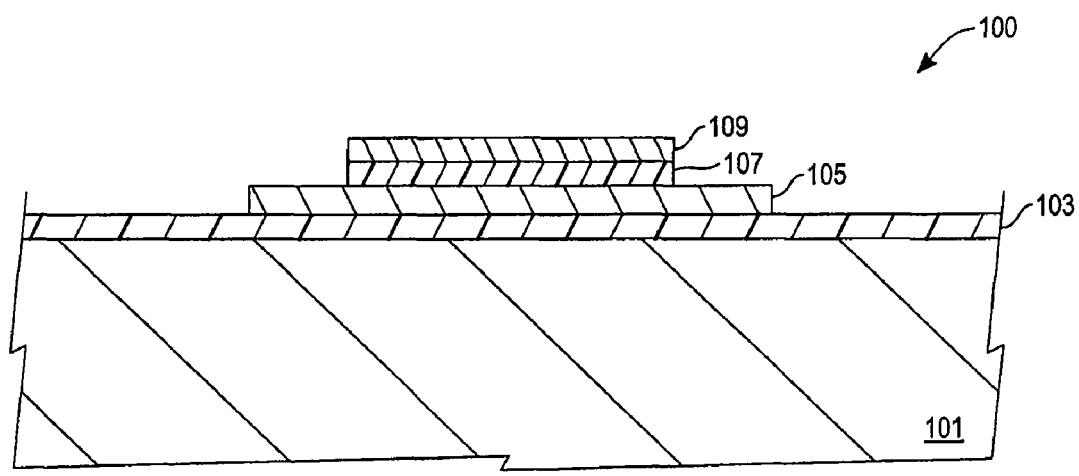
*Fig._1 (Prior Art)*
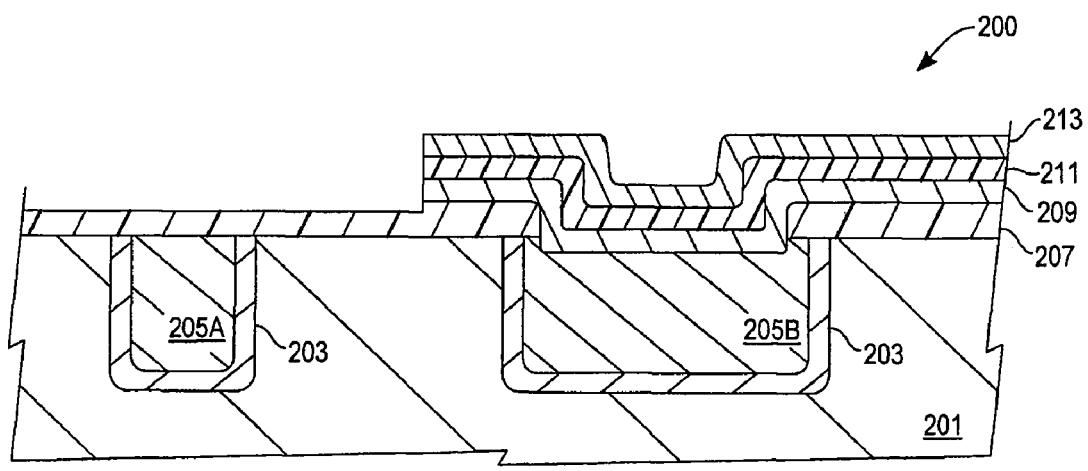
*Fig._2 (Prior Art)*

METHOD FOR FABRICATING CONDUCTING PLATES FOR A HIGH-Q MIM CAPACITOR

RELATED APPLICATIONS

This application is a divisional of U.S. patent application Ser. No. 11/549,052, filed on Oct. 12, 2006, now U.S. Pat. No. 7,601,604, which is hereby incorporated by reference in its entirety.

TECHNICAL FIELD

The present invention relates generally to electronic devices, and more particularly to dual-copper plate capacitors integrated with solid state integrated circuit devices.

BACKGROUND ART

Semiconductor device performance improvements have historically been achieved by reducing device dimensions. The device miniaturization trend has progressed to a point where contemporary integrated circuits (ICs) are fabricated with deep sub-micron device feature sizes. The trend has placed increased emphasis on miniaturization of discrete passive components that are required to function with miniaturized active devices.

In addition to reduced feature sizes, recent trends have focused on replacing conventional aluminum with copper as the conductive medium. As wire widths in integrated circuits continue to shrink, the electrical conductivity of the wiring material itself becomes increasingly important. In this regard, aluminum, which has been the material of choice since the integrated circuit art began, is becoming less attractive than conductors such as gold, silver, and especially copper. Copper is also more resistant than aluminum to electromigration, a property that grows in importance as wire widths decrease. Electromigration is a mass transport effect caused by electrons in electrical current flow colliding with stationary atoms. The collision can push the stationary atoms in the direction of the electron flow. Effects of electromigration are most pronounced in narrow passages (i.e., areas of increased current density) and can lead to a contact void.

As a result of its numerous electrical advantages over aluminum, copper has found increased application in the creation of discrete components, most notably discrete capacitors that are formed within or above the surface of a semiconductor-based IC. Copper provides improved conductivity and reliability but does provide a process challenge where a layer of copper must be patterned and etched, partially due to the fact that copper does not readily form volatile species during the etching process. To overcome the etch problem, other methods of creating interconnect lines using copper have been proposed, including depositing copper patterns using selective electroless plating.

A limit on the speed of advanced ICs is set by a signal propagation delay in conductive interconnect lines, which is determined by the time constant of the lines. The time constant is the product of the resistance, R, of the line and the capacitance, C, between the line and all adjacent lines; hence, an RC time constant. Using a lower resistivity conductive material decreases interconnect RC time constant delays resulting in an overall increase in device speed.

Resistance, R, of a structure is determined by the following equation $$R = \frac{\rho L}{WT}$$

where $\rho$ is the resistivity of a conductive material, L is the length of the conductive material, W is the width of the conductive material, and T is the thickness of the conductive material.

The limited availability of low-loss integrated capacitor structures has long hindered the development of integrated circuits such as passive filters, voltage controlled oscillators (VCO), matching networks, and transformers. Contemporary portable communications environments strive to achieve more fully integrated circuits that operate at radio frequencies (RF) and microwave frequencies. Recent trends indicate a push to integrate entire receivers onto a single substrate. Planar capacitors fabricated from high resistivity materials tend to suffer from high losses and low quality factors (Q factors) at radio frequencies. The losses and low Q factors are generally attributable to dielectric losses incurred from parasitic capacitances and resistive losses due to the use of thin conductors with relatively high resistance. The Q factor is defined as $$Q = \frac{E_S}{E_1},$$

where $E_S$ is energy that is stored in the reactive portion of the component and $E_1$ is energy that is lost in the reactive portion of the component.

For high frequency signals, such as signals in the 10 GHz to 100 GHz range, the value of the Q factor obtained from silicon-based capacitors is significantly degraded. For applications in this high frequency range, monolithic capacitors have been researched using a base substrate other than silicon for the creation of the capacitors. Such monolithic capacitors have, for instance, been created using sapphire or GaAs as a base. These capacitors have a considerably lower parasitic capacitance than their silicon counterparts and therefore provide higher frequencies of resonance of an RC circuit. Where, however, more complex applications are required, the need still exists to create capacitors using silicon as a substrate base.

With reference to FIG. 1, a cross-sectional view of a prior art capacitor 100 forms a portion of an integrated circuit. A substrate 101 having a dielectric layer 103 is coated with thin layers of metal, such as a titanium (Ti)/titanium-nitride (TiN)/aluminum (Al)/TiN (i.e., Ti/TiN/Al/TiN) film stack. The thin layers of metal, after appropriate etching, serve as a bottom plate 105 of the capacitor 100. The bottom plate 105 is covered with a metal-insulator-metal (MIM) dielectric layer 107, followed by a capacitor top plate 109. The MIM dielectric layer 107 and top plate 109 may each be etched as shown. The top plate 109 is frequently comprised of either a Ti/TiN/Al/TiN metal film stack (i.e., the same type of metal film stack as the bottom plate 105) or may be comprised of Ti, tantalum (Ta), or tantalum nitride (TaN). Conductive lines (not shown) are provided to each of the capacitor plates 105, 109 by either additive or subtractive metal patterning processes.

In FIG. 2, an alternative prior art construction of an integrated circuit capacitor 200 includes a substrate 201, a copper-barrier layer 203, and portions of electroplated or sputtered first 205A and second 205B copper lines. In a typical damascene process, the copper-barrier layer 203 prevents migration of copper molecules into surrounding areas of the substrate 201. The copper-barrier layer 203 is formed from a material having high electrical conductivity while maintaining a low copper diffusivity to chemically isolate a copper conductor from the substrate 201. The copper-barrier layer 203 further provides for adhesion of the subsequently formed copper lines 205A, 205B. A blanket dielectric layer 207 is deposited over the substrate 201 and exposed portions of the first 205A and second 205B copper lines. A portion of the blanket dielectric layer 207 is etched to expose the second copper line 205B. The second copper line 205B forms the bottom plate of the integrated circuit capacitor 200. A Ta layer 209 is deposited followed by a MIM dielectric layer 211. A top plate 213 of the capacitor 200 is formed over the MIM dielectric layer 211. The top plate 213 is comprised of a Ti/TiN/Al/TiN metal film stack. Alternatively, the top plate 213 is comprised of Ti, Ta, or TaN. Conductive lines (not shown) are provided to each of the capacitor plates 205B, 213 by either additive or subtractive metal processes.

Either of the prior art alternatives described with reference to FIG. 1 or 2 have good linearity due to the planar design of each. The good linearity generally makes MIM planar capacitors a preferred choice in integrated circuit designs and specifically in radio-frequency applications.

However, the prior art alternatives also share similar limitations. RF applications also require a high Q factor. The Q factor, as shown above, is strongly dependent on the resistivity of the capacitor conducting plates. Since all of the materials listed in the prior art structures (e.g., Ti, TiN, Ta, Al, etc.) have a higher resistivity than copper, the Q factor will be low unless both conducting plates are fabricated from copper. Although some dual copper plate capacitor integrated circuit designs do exist, each is plagued by expensive damascene process steps required for each of the capacitor plates.

Therefore, what is needed is a dual copper plate integrated circuit capacitor and a process for producing the same which is readily and economically integrated into a typical fabrication process flow.

SUMMARY

In an exemplary embodiment, the present invention is a method of forming one or more integrated circuit capacitors on a substrate. The method includes forming a trench in the substrate, lining the trench with a first copper-barrier layer, and substantially filling the trench with a first copper layer. The first copper layer is substantially chemically isolated from the substrate by the first copper-barrier layer. A second copper-barrier layer is formed over the first copper layer and a first dielectric layer is formed over the second copper-barrier layer. The dielectric layer is substantially chemically isolated from the first copper layer by the second copper-barrier layer. A third copper-barrier layer is formed over the dielectric layer and a second copper layer is formed over the third copper-barrier layer. The second copper layer is formed in a non-damascene process.

In another exemplary embodiment, the present invention is a method of forming one or more integrated circuit capacitors on a substrate where the method includes forming a trench in a substrate, lining the trench with a first copper-barrier layer, and substantially filling the trench with a first copper layer. The first copper layer is substantially chemically isolated from the substrate by the first copper-barrier layer. A second copper-barrier layer is formed over the first copper layer and a first dielectric layer is formed over the second copper-barrier layer. The dielectric layer is substantially chemically isolated from the first copper layer by the second copper-barrier layer. A third copper-barrier layer is formed over the dielectric layer and a second copper layer is formed over the third copper-barrier layer. The second copper layer is formed in a non-damascene process. An etch mask located substantially over the trench is applied and patterned. Portions of the second copper-barrier layer, the first dielectric layer, the third copper-barrier layer, and the second copper layer which are not underlying the etch mask are etched. A dielectric cap layer is formed over the second copper layer. The second copper layer is isotropically etched and partially undercut. The undercut allows portions of the dielectric cap layer which are unsupported by the second copper layer to collapse over edges of the second copper layer.

In another exemplary embodiment, the present invention is an integrated circuit capacitor comprising a trench fabricated in a base substrate, a first copper-barrier layer substantially lining the trench, a first copper plate fabricated over the first copper-barrier layer and substantially filling the trench, a second copper-barrier layer formed over an uppermost portion of the first copper plate, and a first dielectric layer formed over the second copper-barrier layer. The first dielectric layer is configured to be in electrical communication with the first copper plate. A third copper-barrier layer is formed over the first dielectric layer and a second copper plate is fabricated over the third copper-barrier layer. The second copper plate is formed by a non-damascene process and is configured to be in electrical communication with the first dielectric layer.

In another exemplary embodiment, the present invention is an integrated circuit capacitor comprising a first copper-barrier layer substantially formed over a base substrate and a first copper plate fabricated over the first copper-barrier layer. The first copper layer is substantially chemically isolated from the substrate by the first copper-barrier layer. A second copper-barrier layer is formed over an uppermost portion of the first copper plate and a first dielectric layer is formed over the second copper-barrier layer. The first dielectric layer is configured to be in electrical communication with the first copper plate and further is chemically isolated from the first copper plate by the second copper-barrier layer. A third copper-barrier layer is formed over the first dielectric layer and a second copper plate is fabricated over the third copper-barrier layer. The second copper plate is substantially chemically isolated from the first dielectric layer; the second copper plate further being formed by a non-damascene process and configured to be in electrical communication with the first dielectric layer.

In another exemplary embodiment, the present invention is a n integrated circuit capacitor comprising a trench fabricated in a base substrate, a first copper-barrier layer substantially lining the trench, a first copper plate fabricated over the first copper-barrier layer and substantially filling the trench, a second copper-barrier layer formed over an uppermost portion of the first copper plate, and a first dielectric layer formed over the second copper-barrier layer. The first dielectric layer is configured to be in electrical communication with the first copper plate. A third copper-barrier layer is formed over the first dielectric layer and a second copper plate is fabricated over the third copper-barrier layer. The second copper plate is formed by a non-damascene process and configured to be in electrical communication with the first dielectric layer. A collapsed dielectric cap layer substantially surrounds the second copper plate except for a surface of the second copper plate nearest to the third copper-barrier layer.

BRIEF DESCRIPTION OF THE DRAWINGS

FIG. 1 is a cross-sectional view of an integrated circuit capacitor fabricated in accordance with the prior art.

FIG. 2 is a cross-sectional view of an integrated circuit capacitor fabricated in a copper damascene process in accordance with the prior art.

DETAILED DESCRIPTION

Figure 3A:
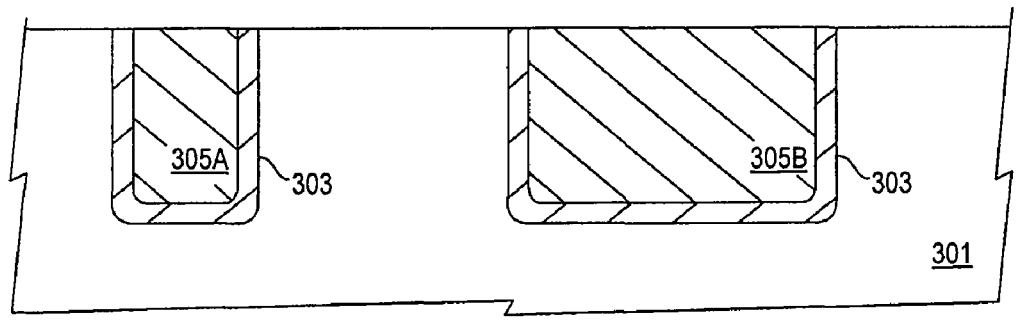
FIGS. 3A-3P are cross-sectional views of various stages of processing steps of a capacitor having both plates fabricated from copper in accordance with various exemplary embodiments of the present invention.

With reference to FIG. 3A, a base substrate 301 may be a silicon wafer. Alternatively, another elemental Group IV semiconductor or compound semiconductor (e.g., Groups III-V or II-VI) in either wafer or non-wafer forms may be selected for the base substrate 301. Further, the base substrate 301 may be fabricated from silicon-on-insulator or a variety of other base materials known to those of skill in the art.

The base substrate 301 may have fabricated thereon a plurality of active integrated circuit devices (not shown). Methods of fabrication of the plurality of active integrated circuit devices are known in the art. The base substrate 301 includes trenches which have a copper-barrier layer 303. The copper-barrier layer 303 substantially lines the trench prevents migration of copper molecules into surrounding areas of the base substrate 301. The copper-barrier layer 303 is formed from a material having a high electrical conductivity while maintaining a low copper diffusivity to chemically isolate any subsequently formed copper conductors from the base substrate 301. The copper-barrier layer 303 is frequently a single or bi-layer deposition from materials including cobalt-based alloys, ruthenium-based alloys, silicon nitride, silicon-copper-nitride, tantalum, and tantalum nitride. In a specific exemplary embodiment, the copper-barrier layer 303 is 300 Å of tantalum followed by a 400 Å to 600 Å copper seed layer. The copper seed layer is commonly used although ruthenium-based seedless layers are beginning to emerge in the art. If employed, the seed-layer provides a low-resistance conductor for plating current that drives a subsequent electroplating process and also facilitates film nucleation. The copper-barrier layer 303 further provides for adhesion of subsequently formed first 305A and second 305B copper fill areas.

In this exemplary embodiment, the first copper fill area 305A is not necessarily a part of the present invention. The first copper fill area 305A may simply be a copper conducting line proximate to the capacitor of the present invention or, alternatively, may be a copper conducting line which serves to electrically connect the second copper fill area 305B to other portions of the integrated circuit (not shown). Regardless, the second copper fill area 305B forms at least a portion of a bottom plate of the MIM capacitor. Further, the copper-barrier layer 303 and the second copper fill area 305B do not need to be formed in a trench. Consequently, in an alternative embodiment, the barrier layer 303 and the second copper fill area 305B may be formed in a planar fashion over an uppermost surface of the substrate 301.

As is known in the art, copper has superior properties over Al, Ti, Ta, and various other metallic materials in terms of both an inherently lower electrical resistivity and a pronounced resistance to electromigration. However, there are few volatile copper compounds. Consequently, copper can ordinarily not be patterned by typical subtractive patterning techniques such as photoresist masking and plasma etching typically used with other metallic materials. Copper processing thus typically uses an additive patterning process referred to as copper damascene processing.

In a copper damascene process, either an underlying dielectric layer and/or base substrate is patterned and etched (using standard photolithographic processes) with open trenches or openings where a conductor will be formed. A thick coating of copper is added such that the copper significantly overfills the trenches or openings. A chemical mechanical planarization (CMP) process removes the copper to a level coplanar with surrounding local features. Frequently, the surrounding local features are chosen to be a dielectric material, such as silicon dioxide ($SiO_2$), which serves as a hard etch-stop material to determine an end-point to the CMP process step. Copper contained within the trenches or openings is not removed and becomes the patterned conductor. Any surrounding dielectric material may be etched or left in place depending upon subsequent processes.

Figure 3B:
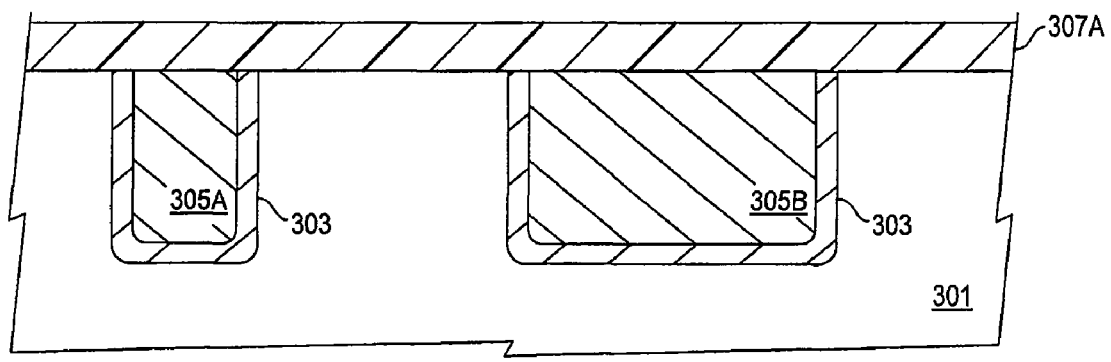

In FIG. 3B, a first dielectric layer 307A is formed over uppermost portions of the base substrate 301 and the first 305A and second 305B copper fill areas. In a specific exemplary embodiment, the dielectric layer 307A is a deposited silicon nitride ($Si_3N_4$) layer, 500 Å to 1000 Å in thickness. Other types of dielectric materials may also be used such as, for example, a chemical vapor deposition (CVD) deposited silicon dioxide layer.

Figure 3C:
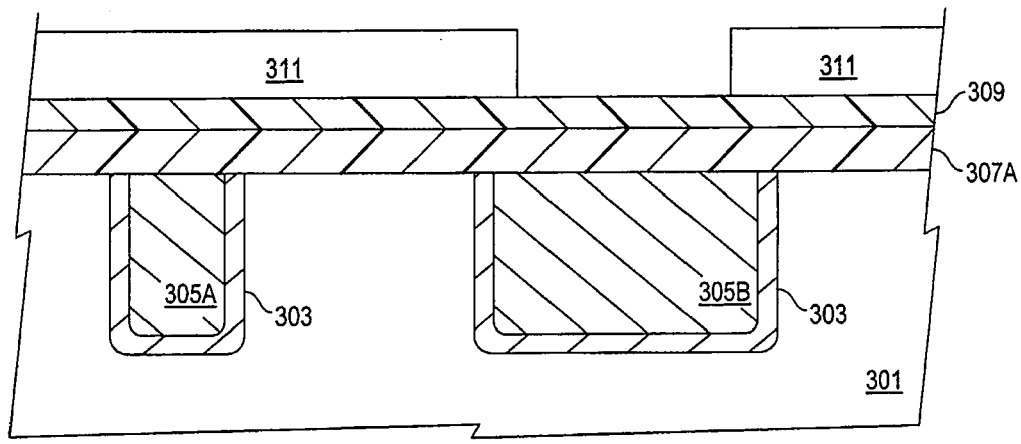
Figure 3D:
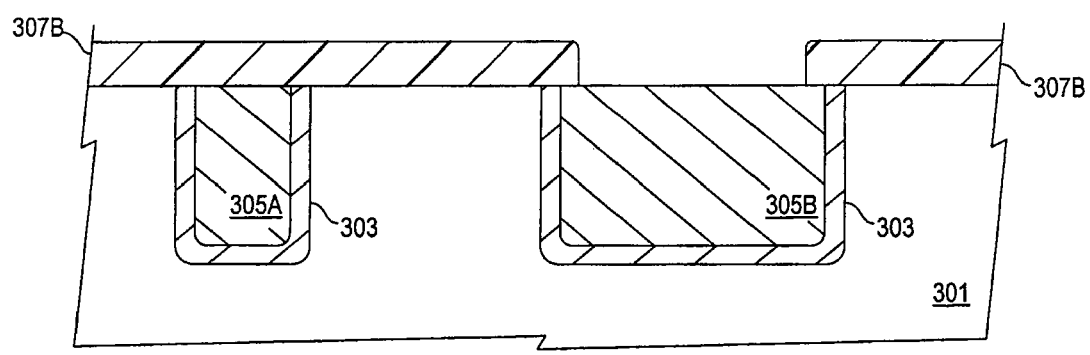

A bottom anti-reflective coating (BARC) layer 309 may be formed over the dielectric layer 307A (FIG. 3C), followed by a coated layer of photoresist. The photoresist is photolithographically exposed, developed, and etched, forming a patterned photoresist layer 311. Portions of the BARC layer 309 and the dielectric layer 309A are anisotropically etched, stopping on the second copper fill area 305B. The patterned photoresist layer 311 and any remaining portions of the BARC layer 309 are removed, leaving a patterned dielectric layer 307B (FIG. 3D). A wet clean may be performed to remove any oxide formation from exposed portions of the second copper fill area 305B.

Figure 3E:
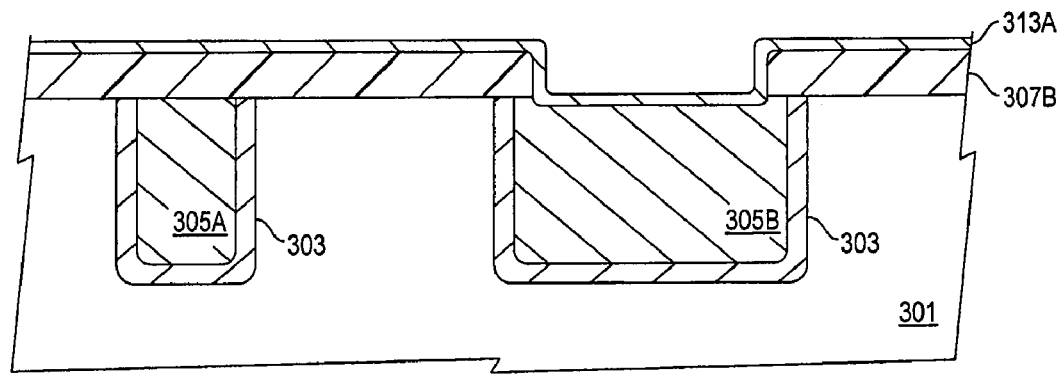

With reference to FIG. 3E, a second copper-barrier layer 313A is formed. In a specific exemplary embodiment, the second copper-barrier layer is a deposited Ta layer, 200 Å to 500 Å thick. Exposed surfaces of tantalum quickly oxidize. An optional oxygen plasma treatment may be used to enhance the effective dielectric constant.

Figure 3F:
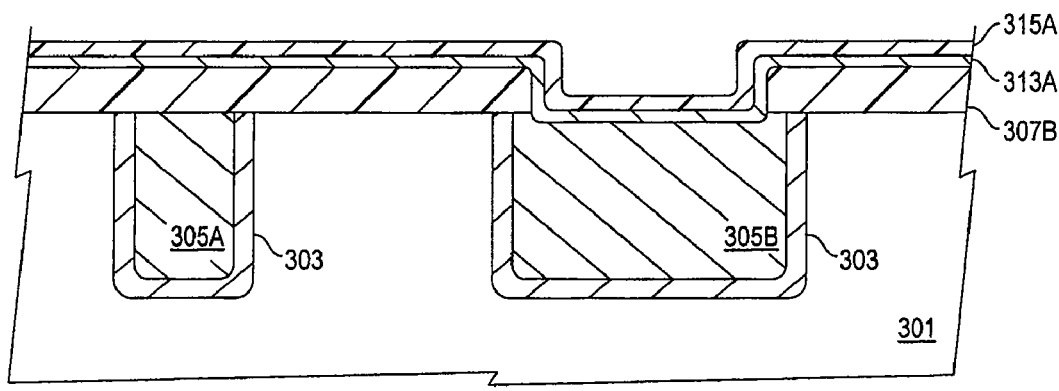

In FIG. 3F, an MIM dielectric layer 315A is formed. The MIM dielectric layer may be comprised of, for example, $Si_3N_4$ or one or more other high-k dielectric materials. High-k dielectric materials are known in the art and include films such as tantalum pentoxide ($Ta_2O_5$), zirconium oxide ($ZrO_2$), hafnium oxide ($HfO_2$), and lead-zirconate-titanate (PZT). However, other dielectric materials may readily be employed as well to form the MIM dielectric layer 315A. In a specific exemplary embodiment, the MIM dielectric layer 315A can range from 20 Å to 1000 Å in thickness.

Figure 3G:
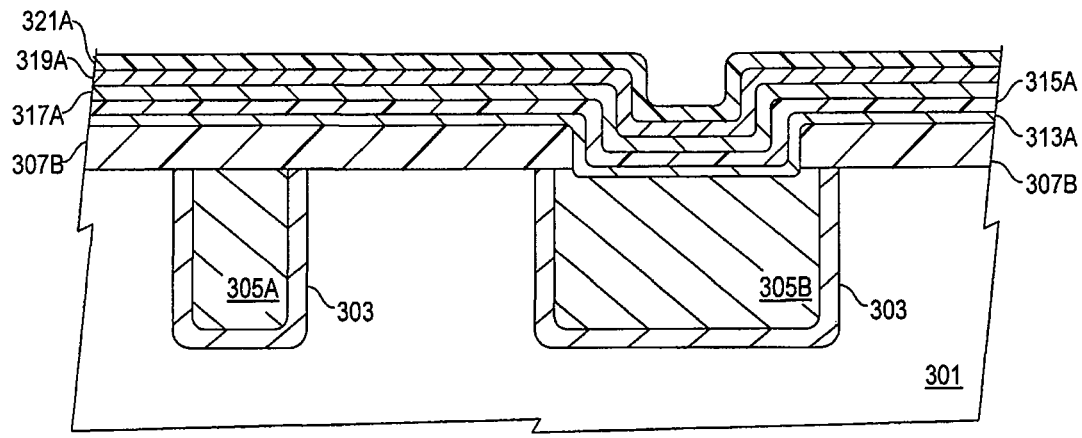

In FIG. 3G, a third copper-barrier layer 317A is formed followed by a combined copper-seed/copper layer 319A and a dielectric cap layer 321A. In a specific exemplary embodiment, the third copper-barrier layer 317A is a Ta layer, 100 Å to 300 Å in thickness, the combined copper-seed/copper layer 319A is 600 Å to 2500 Å thick, and the dielectric cap layer 321A is $Si_3N_4$ 300 Å to 1000 Å in thickness. Alternatively, the combined copperseed/copper layer 319A may be comprised of, for example, a sputtered or electroplated copper layer only without a copper-seed layer. In either form of the copper layer 319A, the fabrication process is non-damascene in nature. For example, a CMP step is not required after formation of the copper layer 319A. Consequently, the copper layer 319A will not have any types of fine striations on either face as may be found in a damascene process (although such striations would have little or no effect on the present invention).

Figure 3H:
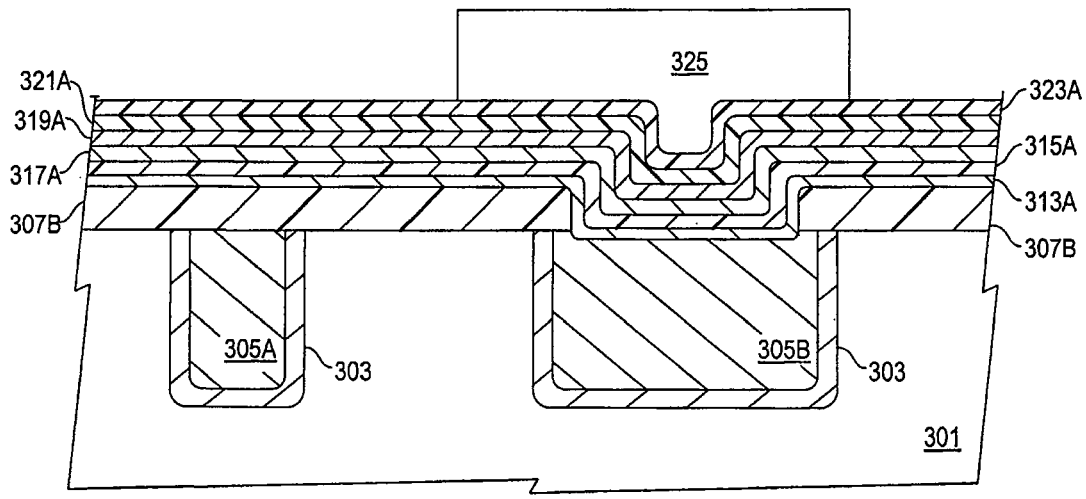
Figure 3I:
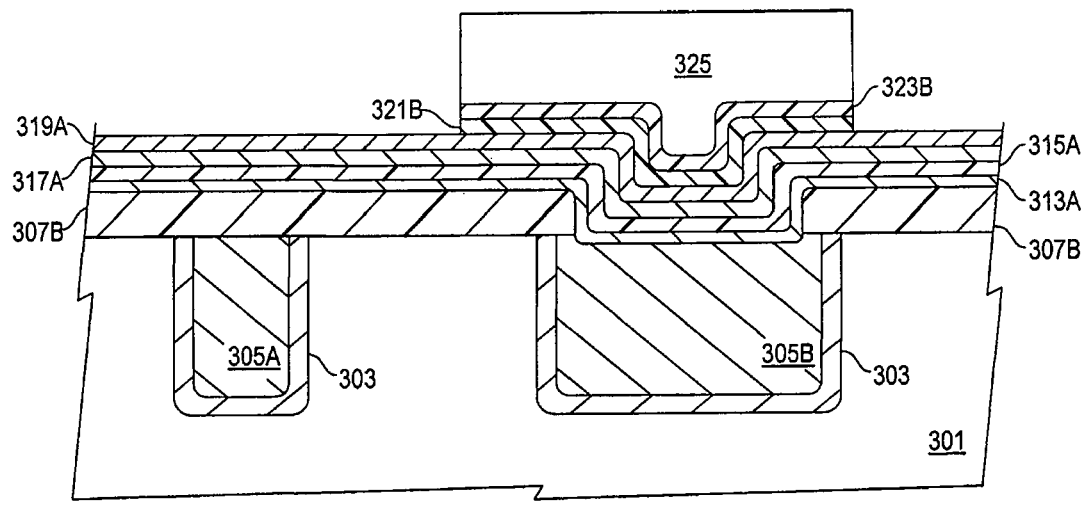

With reference to FIG. 3H, a sequence of lithography to form a MIM top plate commences. A second BARC layer 323A is formed over the dielectric cap layer 321A. A photoresist layer is formed over the second BARC layer 323A. The photoresist layer is exposed, developed, and etched, forming a MIM top plate patterned photoresist layer 325. The patterned photoresist layer 325 serves as an etch mask and protects underlying materials while portions of both the second BARC layer 323A and the dielectric cap layer 321A are each etched (FIG. 3I) forming an etched second BARC layer 323B and etched dielectric cap layer 321B, respectively.

Figure 3J:
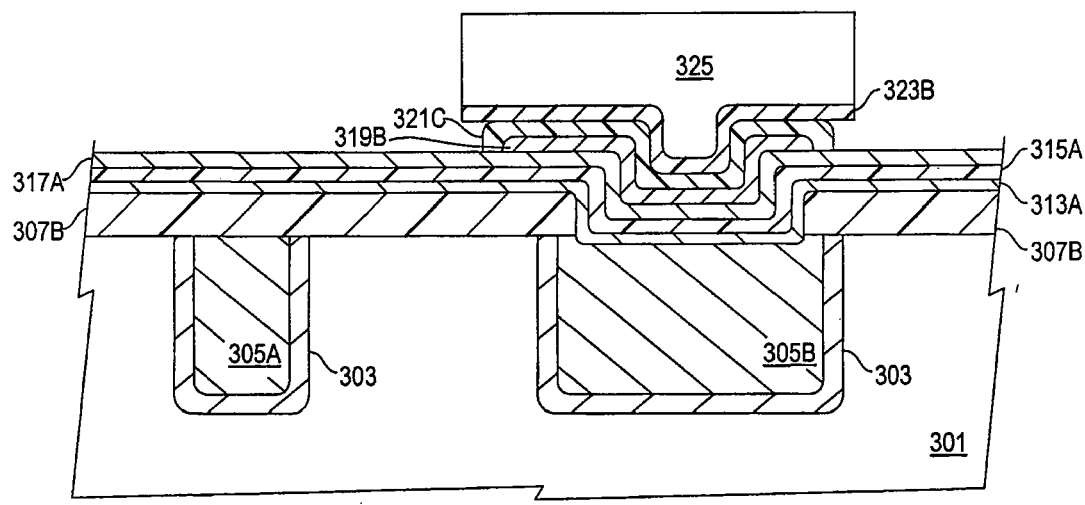

An isotropic copper wet etch chemistry is employed to etch the combined copper-seed/copper layer 319A, thus slightly undercutting the etched dielectric cap layer 323B and forming a copper MIM top plate 319B (FIG. 3J). Although not required to practice or produce the MIM capacitor of the present invention, shortly after the etched copper is approximately equal to the thickness of the copper seed layer, the dielectric cap layer 321B collapses, forming a collapsed dielectric layer 321C. The collapsed dielectric layer 321C protects the underlying MIM top plate 319B from subsequent etching. In a specific exemplary embodiment, the isotropic copper wet etch chemistry is selected to have an etch rate of less than 5000 Å per minute with a higher selectivity to BARC, photoresist, and copper.

Alternatively, an anisotropic dry etch such as, for example, a reactive-ion etch (RIE), may be used instead of the isotropic wet etch. Various combinations of chemicals may be incorporated to increase selectivity of the RIE such that, for example, silicon nitride is more readily etched than any adjacent non-silicon nitride layers. Such selectivity enhancements are known in the art. With the anisotropic dry etch, the etched dielectric cap layer 323B will not be undercut sufficiently to form the collapsed dielectric layer 321C. However, the collapsed dielectric layer 321C is not necessary to either practice or fabricate the present invention.

Figure 3K:
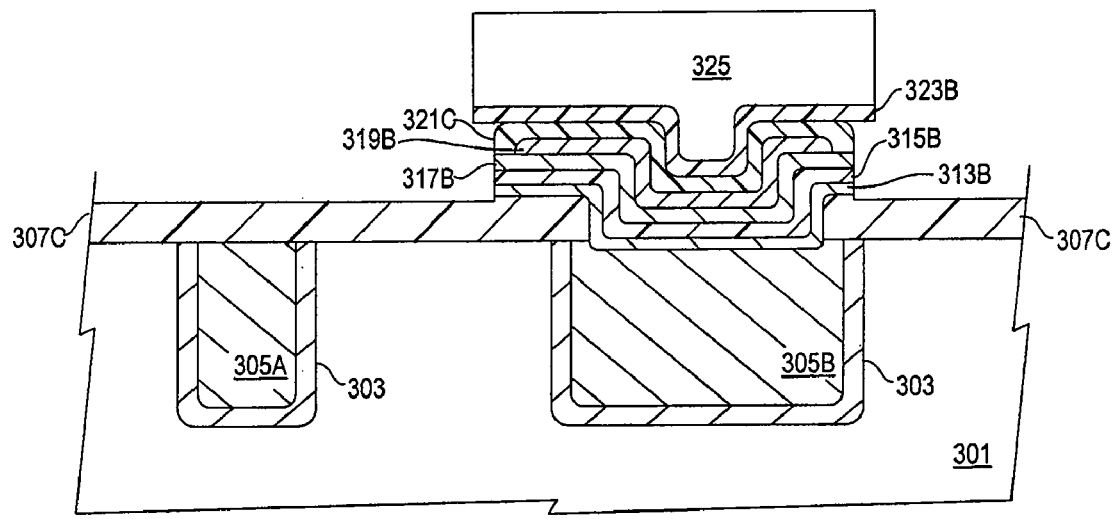

With reference to FIG. 3K, portions of each of the remaining layers overlying the patterned dielectric layer 307B, namely, the second copper-barrier layer 313A, the MIM dielectric layer 315A, and the third copper-barrier layer 317A, are etched thus forming an etched second copper-barrier layer 313B, an etched MIM dielectric layer 315B, and an etched third copper-barrier layer 317B. Note also the patterned dielectric layer 307B may be partially etched, depending on the material selected to form the patterned dielectric layer 307B and the etchant selected, thus forming an etched patterned dielectric layer 307C. Consequently, the etched patterned dielectric layer 307C serves as an etch-stop layer. In a specific exemplary embodiment, RIE is selected to etch portions of the layers overlying the patterned dielectric layer 307B.

Figure 3L:
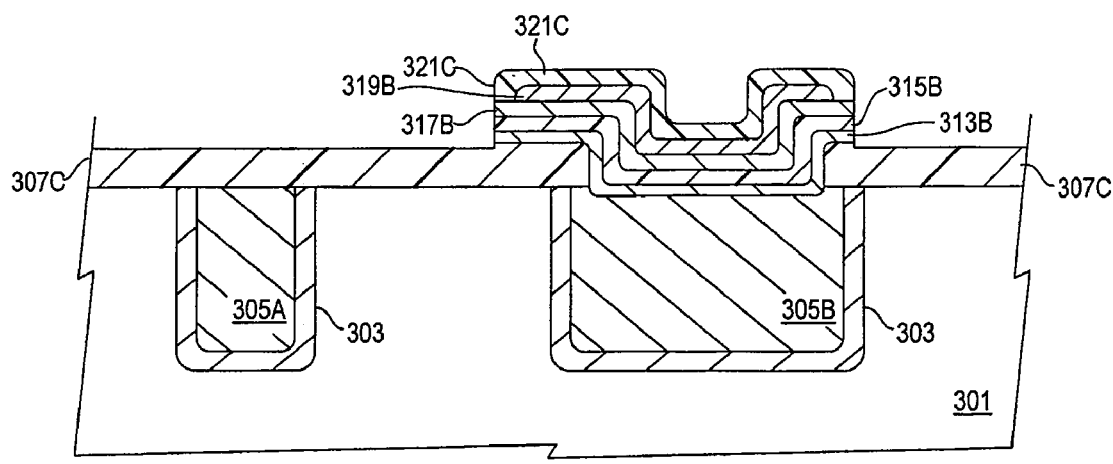
Figure 3M:
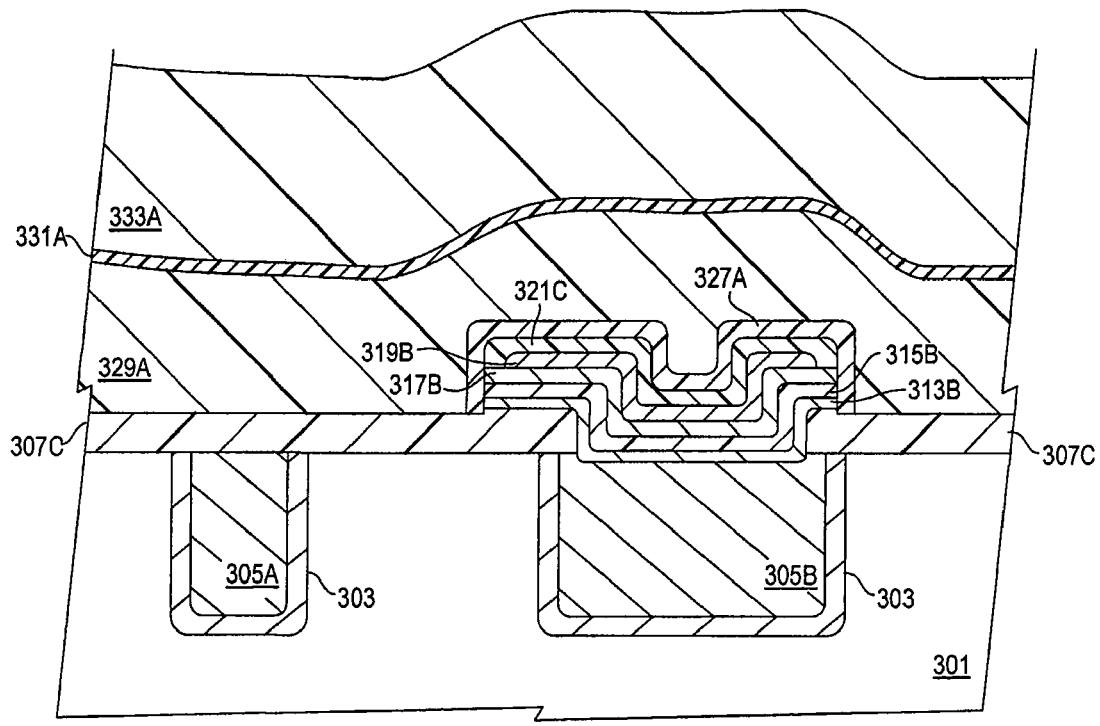

The MIM top plate patterned photoresist layer 325 and the etched second BARC layer 323B are removed in FIG. 3L by, for example, an oxygen-plasma ashing step. Construction of the high-Q planar MIM capacitor is substantially complete. Steps for producing a top-plate electrode commence with FIG. 3M in which a multi-layer dielectric is formed over the completed MIM capacitor in preparation for a dual-damascene electrode process. Each of the first 327A, second 329A, third 331A, and fourth 333A dielectric layers are chosen so as to allow a selective etchant to be used in which one layer is etched faster than one or more adjacent layers. For example, in a specific exemplary embodiment, the first dielectric layer 327A is selected to be $Si_3N_4$ ranging from 200 Å to 1000 Å in thickness, the second dielectric layer 329A is selected to be a deposited oxide ranging from 2000 Å to 8000 Å in thickness, the third dielectric layer 331A is selected to be $Si_3N_4$ ranging from 100 Å to 700 Å in thickness, and the fourth dielectric layer 333A is selected to be a deposited oxide ranging from 0.5 μm to 1 μm in thickness. One of skill in the art will recognize, however, that the ranges given are approximate and may vary depending upon factors such as particular films chosen and specific process parameters employed.

Figure 3N:
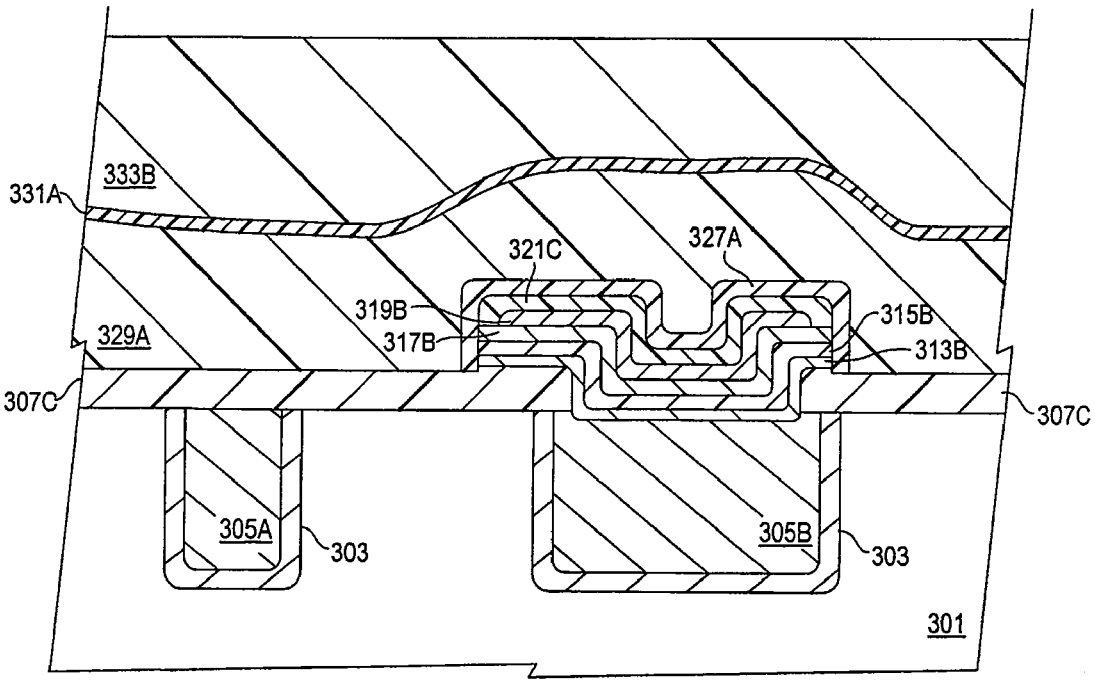
Figure 3O:
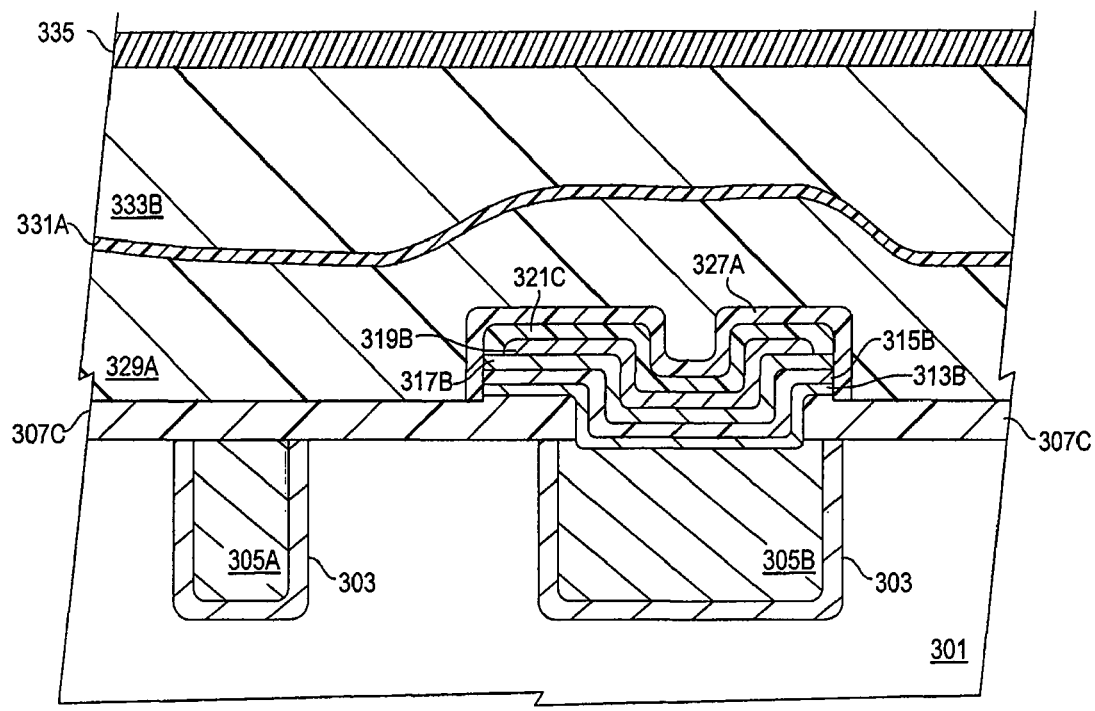

In FIG. 3N, a chemical-mechanical planarization step planarizes the fourth dielectric layer 333A creating a planarized dielectric layer 333B. In FIG. 3O, A fifth dielectric layer 335 is formed over the planarized dielectric layer 333B. A thickness range of the fifth dielectric layer 335 may be, for example, 300 Å to over 1000 Å in thickness.

In a specific exemplary embodiment, the fifth dielectric layer 335 is a $Si_3N_4$ hard mask. In this embodiment, the hard mask acts (1) as a complementary anti-reflection dielectric during subsequent via and trench lithography steps; and (2) to protect the planarized dielectric layer 333B during a subsequent etch of the first dielectric layer 327A. The etch of the first dielectric layer 327A is generally performed after the transfer of the trench pattern into the fifth dielectric layer 335 and the planarized dielectric layer 333B and oxygen-plasma ashing of a trench lithography BARC/photoresist stack (not shown). The first dielectric layer 327A etch is a self-aligned etch without the protection of the removed BARC/photoresist stack. Therefore, the $Si_3N_4$ hard mask is mainly a sacrificial layer and is used to preserve the trench depth in the underlying oxide.

Figure 3P:
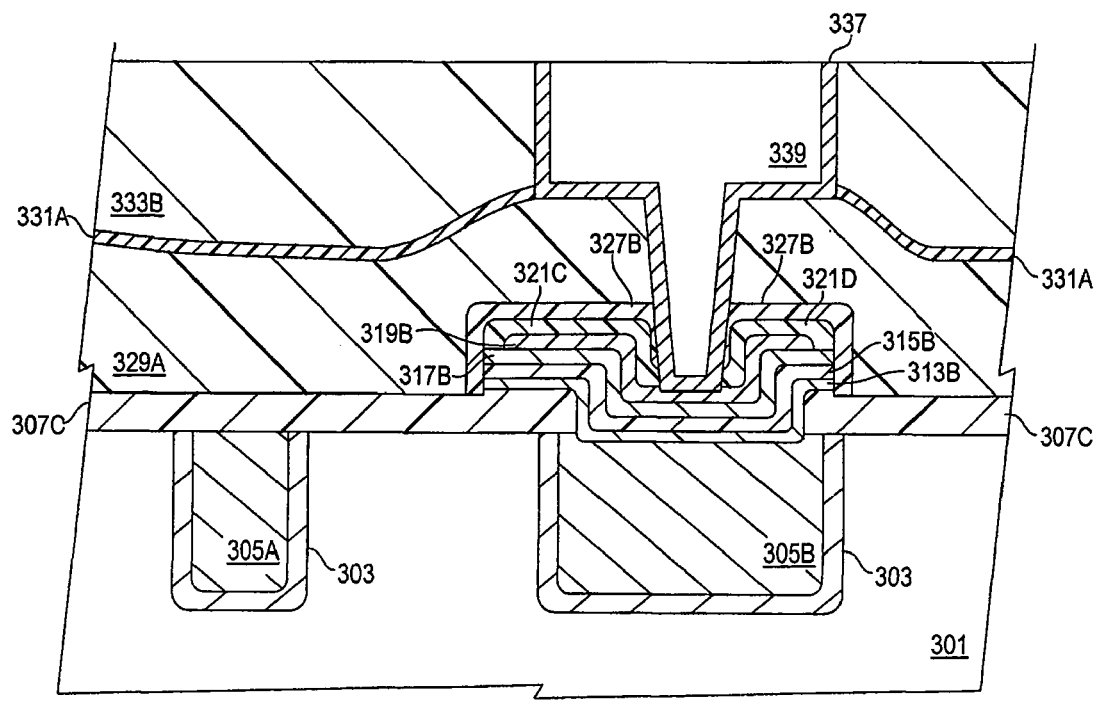

With reference to FIG. 3P, the overlying multi-layer film stack is etched forming etched first 327B, second 329B, third 331B, and fourth 333B dielectric layers. The various layers define a trench bottom/via top wherein the via extends to electrically contact the copper MIM top plate 319B. Via and trench walls are lined with a copper-barrier layer 337 and a dual-damascene electroplated copper layer 339 simultaneously fills the via and the trench, thus completing the electrode connection to the copper MIM top plate 319B. As is known in the art, growth of the electroplated copper layer 339 is polycrystalline. Grain size within the copper layer 339 is dependent on factors such as texture (i.e., microroughness) of underlying layers, parameters of growth conditions such as temperature, plating voltages, etc., as well as dimensions of trenches to be filled (e.g., dimensions of grooves or vias). Grain size and consequently overall resistivity of the copper trench/via may be controlled through appropriate anneal steps as needed.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that many types of deposition technology, such as sputtering, chemical vapor deposition (CVD), physical vapor deposition (PVD), electron beam evaporation (EBE), electrochemical deposition (ECD), thermal evaporation, and others may readily be employed for various layers described. Further, the substrate type may be selected based upon an intended use of a finalized product. For example, an ASIC used as an integrated circuit for a computer may be formed on a silicon wafer. In an RF integrated circuit used for lightweight applications or flexible circuit applications, such as a cellular telephone or personal data assistant (PDA), the integrated circuit may be formed on a polyethyleneterephthalate (PET) substrate deposited with silicon dioxide and polysilicon followed by an excimer laser annealing (ELA) anneal step. Skilled artisans will appreciate that other types of semiconducting and insulating materials other than those listed may be employed. For example, a BARC layer may improve processing and edge wall definition of photoresist layer used as etch masks, but the BARC layer is not required. Additional particular process fabrication and deposition techniques, such as low pressure chemical vapor deposition (LPCVD), ultra-high vacuum CVD (UHCVD), and low pressure tetraethoxysilane (LPTEOS) may be readily employed for various layers and still be within the scope of the present invention. Although the exemplary embodiments describe particular types of dielectric and semiconductor materials, one skilled in the art will realize that other types of materials and arrangements of materials may also be effectively utilized and achieve the same or similar advantages. The specification and drawings are, accordingly, to be regarded in an illustrative rather than a restrictive sense.

What is claimed is:

1. An integrated circuit capacitor comprising:
   a trench fabricated in a base substrate;
   a first copper-barrier layer substantially lining the trench;
   a first copper plate fabricated over the first copper-barrier layer and substantially filling the trench;
   a second copper-barrier layer formed over an uppermost portion of the first copper plate;
   a first dielectric layer formed over the second copper-barrier layer, the first dielectric layer configured to be in electrical communication with the first copper plate;
   a third copper-barrier layer formed over the first dielectric layer; and
   a second copper plate fabricated over the third copper-barrier layer, the second copper plate being formed by a non-damascene process and configured to be in electrical communication with the first dielectric layer.

2. The integrated circuit capacitor of claim 1 wherein neither face of the second copper plate has marks from a damascene process.

3. The integrated circuit capacitor of claim 1 wherein the first dielectric layer is silicon nitride.

4. An integrated circuit capacitor comprising:
   a first copper-barrier layer substantially formed over at least a portion of a base substrate;
   a first copper plate fabricated over the first copper-barrier layer, the first copper layer being substantially chemically isolated from the substrate by the first copper-barrier layer;
   a second copper-barrier layer formed over an uppermost portion of the first copper plate;
   a first dielectric layer formed over the second copper-barrier layer, the first dielectric layer configured to be in electrical communication with the first copper plate and further being chemically isolated from the first copper plate by the second copper-barrier layer;
   a third copper-barrier layer formed over the first dielectric layer; and
   a second copper plate fabricated over the third copper-barrier layer, the second copper plate being substantially chemically isolated from the first dielectric layer, the second copper plate further being formed by a non-damascene process and configured to be in electrical communication with the first dielectric layer.

5. The integrated circuit capacitor of claim 4 wherein neither face of the second copper plate has marks from a damascene process.

6. The integrated circuit capacitor of claim 4 wherein the first dielectric layer is silicon nitride.

7. An integrated circuit capacitor comprising:
   a trench fabricated in a base substrate;
   a first copper-barrier layer substantially lining the trench;
   a first copper plate fabricated over the first copper-barrier layer and substantially filling the trench;
   a second copper-barrier layer formed over an uppermost portion of the first copper plate;
   a first dielectric layer formed over the second copper-barrier layer, the first dielectric layer configured to be in electrical communication with the first copper plate;
   a third copper-barrier layer formed over the first dielectric layer;
   a second copper plate fabricated over the third copper-barrier layer, the second copper plate being formed by a non-damascene process and configured to be in electrical communication with the first dielectric layer; and
   a collapsed dielectric cap layer substantially surrounding the second copper plate except for a surface of the second copper plate nearest to the third copper-barrier layer.

8. The integrated circuit capacitor of claim 7 wherein neither face of the second copper plate has marks from a damascene process.

9. The integrated circuit capacitor of claim 7 wherein the first dielectric layer is silicon nitride.

* * * * *